(12) United States Patent
Liu et al.

(10) Patent No.: US 6,271,127 B1
(45) Date of Patent: Aug. 7, 2001

(54) METHOD FOR DUAL DAMASCENE PROCESS USING ELECTRON BEAM AND ION IMPLANTATION CURE METHODS FOR LOW DIELECTRIC CONSTANT MATERIALS

(75) Inventors: Qizhi Liu, Santa Ana; David Feiler, Sherman Oaks; Bin Zhao, Irvine; Maureen R. Brongo, Laguna Hills, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/329,569

(22) Filed: Jun. 10, 1999

(51) Int. Cl.[7] .................................................. H01L 21/4763
(52) U.S. Cl. ......................... 438/638; 438/634; 438/672; 438/738; 438/949
(58) Field of Search .................................... 438/637, 638, 438/640, 666, 672, 700, 737, 738, 633, 949, 634

(56) References Cited

U.S. PATENT DOCUMENTS

| | | | |
|---|---|---|---|
| 5,024,969 | * | 6/1991 | Reche .................................... 437/173 |
| 5,759,906 | * | 6/1998 | Lou ....................................... 438/623 |
| 5,916,823 | * | 6/1999 | Lou et al. ............................. 438/738 |
| 6,080,526 | * | 6/2000 | Yang et al. .......................... 430/296 |
| 6,087,724 | * | 7/2000 | Shields et al. ....................... 257/734 |
| 6,114,233 | * | 9/2000 | Yeh ...................................... 438/622 |

OTHER PUBLICATIONS

Berti, A.C., Farina, O.; Manufacturing Advancements in an Organic SOG Process by Ar+ Implantation. 1996 IEEE/SEMI Advanced Semiconductor Manufacturing Conference. pp. 259–264.*

"Making the Move to Dual Damascene Processing", Semiconductor International, Aug. 1997, pp. 79, 80, 92, Peter Singer, editor–in–chief.

* cited by examiner

Primary Examiner—Olik Chaudhuri
Assistant Examiner—Ginette Peralta
(74) Attorney, Agent, or Firm—Snell & Wilmer, L.L.P.

(57) ABSTRACT

Method for dual damascene metallization of semiconductor workpieces which uses a process for creating an etch stop in an insulator thereby eliminating the need for deposition of an etch stop layer. Electron beam exposure is used to cure the insulator, or material having a low dielectric constant. Application of the electron beam to the low dielectric constant material converts the topmost layer of the low dielectric constant material to an etch stop layer, while rapid thermal heating cures the remainder of the low dielectric constant material. Creation of an etch stop layer in the low dielectric constant material can also be achieved by curing the low dielectric constant material using ion implantation.

20 Claims, 7 Drawing Sheets

SUBSTRATE

FIG.4a

COAT HSQ

FIG.4b

E-BEAM CURE

FIG.4c

COAT PHOTORESIST

FIG.4d

EXPOSE AND DEVELOP PHOTORESIST

FIG.4e

ETCH DENSIFIED LAYER

FIG.4f

STRIP PHOTORESIST

FIG.4g

COAT HSQ

FIG.4h

E-BEAM CURE

FIG.4i

COAT PHOTORESIST

FIG.4j

EXPOSE & DEVELOP PHOTORESIST

FIG. 4k

ETCH DENSIFIED LAYER

FIG. 4l

ETCH HSQ

METHOD FOR DUAL DAMASCENE PROCESS USING ELECTRON BEAM AND ION IMPLANTATION CURE METHODS FOR LOW DIELECTRIC CONSTANT MATERIALS

BACKGROUND OF THE INVENTION

1. Technical Field

The present invention relates, generally, to dual damascene processing and, more particularly, to a method for dual damascene processing using electron beam and ion implantation cure methods for a material having a low dielectric constant.

2. Background Art and Technical Problems

Figure 1A:
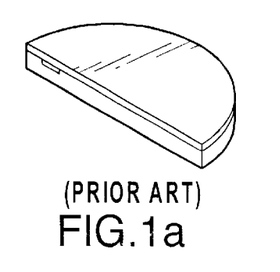
FIG. 1a is a perspective view of a wafer with doped regions.
Figure 1B:
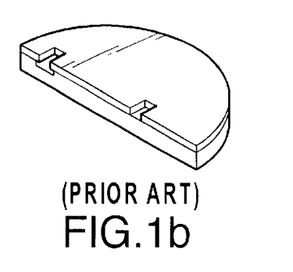
FIG. 1b is a perspective view of a wafer that has been patterned with a contact mask.
Figure 1C:
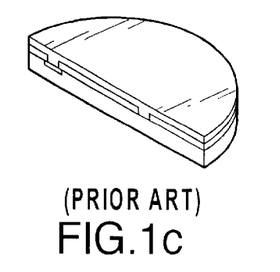
FIG. 1c is a perspective view of a wafer after deposition of a conducting layer after contact masking.
Figure 1D:
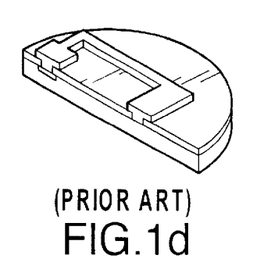
FIG. 1d is a perspective view of a wafer after metal etching of a conducting layer.

Metallization, which generally refers to the materials, methods and processes of wiring together or interconnecting the component parts of an integrated circuit located on the surface of a wafer, is critical to the operation of semiconductor devices. As shown in FIGS. 1a through 1d, the conventional metallization process for a single layer metal system used in fabricating semiconductor devices first involves contact masking which is the etching of contact holes or "contacts" through all the surface layers on a semiconductor device until contact is made with the active regions of the device as shown in FIG. 1b. Next, as shown in FIG. 1c, a thin layer of the conducting metal is deposited over the entire surface of the device and the unwanted portions of the layer are removed by a conventional photomasking and metal etch procedure. After metal etch, thin lines of the metal known as leads or interconnects cover the surface of the device as depicted in FIG. 1d. Typically, a heat treatment step known as alloying is then performed to ensure good electrical contact between the metal and the surface of the wafer.

Figure 2:
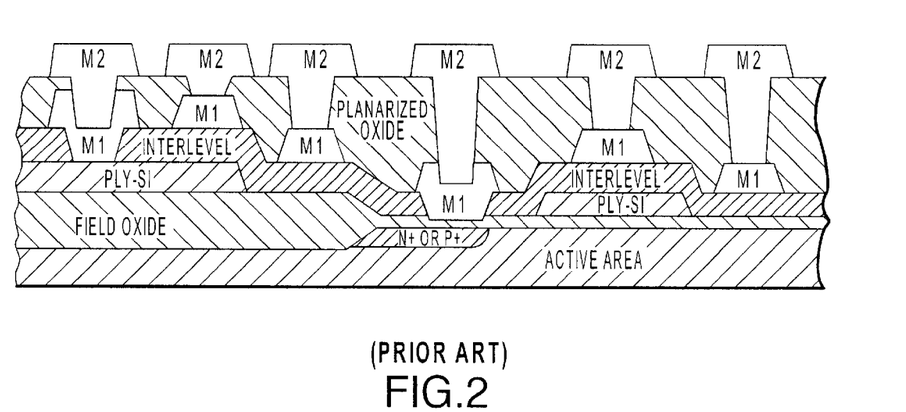
FIG. 2 is a cross section of an exemplary two level metal semiconductor device having very large scale integration (VLSI)

As more and more circuit components are placed on the wafer surface, the amount of space available for surface wiring decreases. In order to overcome this problem, advances in semiconductor processing have resulted in multilevel layering and wiring of circuit components. An example of a two level metallization scheme is shown in FIG. 2. In a multilevel metallization scheme, surface components are left partially wired together after a single level metallization process is performed. Next, a dielectric material is deposited on the surface of the device and a masking step is performed which etches contact holes, know as vias, down to the first level metal. The whole process, including the single level metallization process, is then repeated until a final structure is achieved which comprises two or three levels of metal connected to one another. Multi level metal systems are more costly and have lower yields. In addition, planarization of the wafer surface and intermediate layers require greater attention in order to form reliable current carrying interconnects. In order to function as a good surface conductor, a metal will preferably exhibit good current density, good adhesion to the wafer surface, ease of patterning, good electrical contact with the wafer material, high purity, corrosion resistance and long term stability.

In the past, the primary metallization material used in semiconductor fabrication was aluminum due to the leakage and adhesion problems experienced with the use of gold and the high contact resistance with silicon experienced with copper. However, over time, the semiconductor industry has slowly been moving to the use of copper for metallization due to the alloying and electromigration problems that are seen with aluminum. In addition, the industry has been moving to dual damascene processing which involves creating interconnect lines by etching a trench, and a series of contact holes or vias, in a planar dielectric layer and then filling in both with a metal. After filling the trench and via with metal, the metal and dielectric are then planarized by chemical mechanical polishing (CMP). The industry has recently turned to damascene processing in favor of conventional aluminum/silicon dioxide interconnect techniques in that damascene processing eliminates the need for metal etch. Further, since the industry is moving to prefer copper over aluminum for metallization, the damascene process is even more important in that copper is extremely difficult to etch. In addition to eliminating the need for metal etch, damascene processing also eliminates the need for dielectric gap fill. Another advantage to damascene processing is its ability to achieve higher interconnect packing density than conventional metallization methods.

The industry's drive to achieve smaller dimensions for integrated circuits, a reduction in time delays, an increase in on-chip speed, and lower metal resistance, has resulted in the above mentioned trends, namely a switch to copper from aluminum for metallization, a switch to dual damascene processing over conventional metallization techniques, and a move to using materials with a low dielectric constant. However, due to the risks and expenses associated with incorporating all three large scale trends in manufacturing semiconductor devices, many believe that industry competitors will likely implement only one or two of these changes in fabricating semiconductor devices.

Accordingly, there is a need for a method for semiconductor fabrication which incorporates the use of copper and a low dielectric constant material, with dual damascene metallization, to produce reliable semiconductor devices which possess increased density and efficiency without jeopardizing integrity. In addition, there is also a need for a method for dual damascene processing which functions to decrease the cost and complexity of the semiconductor fabrication process while increasing its efficiency and ability to produce reliable semiconductor workpieces.

SUMMARY OF THE INVENTION

In accordance with one embodiment of the present invention, a hard mask or etch stop for processing a semiconductor workpiece is created by depositing a layer of dielectric material on a substrate and exposing the dielectric layer to either an electron beam or ion implantation such that a topmost layer of the dielectric layer is converted into a hard mask or etch stop thereby eliminating the extra deposition step required in conventional dual damascene metallization processing.

In accordance with a further aspect of the present invention, the dielectric material used for creating the etch stop is preferably a material having a low dielectric constant such as within a range of 1.0 to 3.5. The material having a low dielectric constant may be an organic material, an inorganic material, a polymer, a fluorine containing material, or even a porous material. Some examples of the low dielectric constant material include, but are not limited to, hydrogen silsesquioxane, methyl silsesquioxane, methyl siloxane, fluorineless arylene ether, and benzocyclobutene.

In another embodiment of the present invention, a hard mask or etch stop for processing a semiconductor workpiece is created within a method for dual damascene metallization which includes the steps of I) depositing a first layer of low dielectric constant material on a wafer substrate, ii) curing the first layer of low dielectric constant material such that the topmost layer of the first low dielectric constant material layer is converted into an etch stop or forms a hard mask, iii)

applying a photoresist pattern to the first layer of low dielectric constant material, iv) etching the hard mask or etch stop to form the opening of a via in the first layer of low dielectric constant material, v) depositing a second layer of low dielectric constant material to the first layer of low dielectric constant material containing the via opening, vi) curing the second layer of low dielectric constant material so that the topmost layer of the second layer of low dielectric constant material converts to an etch stop or forms a hard mask, vii) applying a photoresist pattern to the second layer of low dielectric constant material, viii) etching the hard mask or etch stop in the second layer of low dielectric constant material to form a trench opening over the via, ix) etching the first and second layers of low dielectric constant material to form the via and trench, respectively, x) depositing a barrier layer over exposed surfaces of the via and trench to prevent metal diffusion, and xi) filling the via and trench with a metal.

In accordance with a further aspect of the present invention, curing of the first and second layers of low dielectric constant material may be performed by exposing the first and second layers of low dielectric constant material, respectively, to either an electron beam or ion implantation.

In accordance with still a further aspect of the present invention, the electron beam or ion implantation used for curing both the first and second layers of low dielectric constant material is applied in the presence of an ambient such as, for example, argon gas, nitrogen gas, oxygen gas and ammonia gas. In addition, during such processing, the wafer substrate may also be concurrently heated by positioning the back side of the wafer substrate on a heating element such as a hot plate which is incorporated into the chuck that supports the wafer during processing in a processing chamber.

In accordance with yet a further aspect of the present invention, the deposition of a layer of material, such as the low dielectric constant layer, on the workpiece surface may be carried out by a number of methods including, but not limited to, spinning, electroplating, chemical vapor deposition, and sputtering.

In accordance with still another aspect of the present invention, the topmost layer of the low dielectric constant material that has been cured by either an electron beam or ion implantation to form a hard mask can be used as a CMP stop during metal CMP. This is a distinct advantage over curing of low dielectric constant materials by the conventional method of thermal treatment only. The present invention's use of the hard mask created by the application of an electron beam or ion implantation for CMP stop during metal CMP improves process robustness and process window.

Various other aspects of the present invention are set forth with particularity in the detailed description of exemplary embodiments.

BRIEF DESCRIPTION OF THE DRAWINGS

The present invention will hereinafter be described in conjunction with the appended drawing figures, wherein like numerals designate like elements in the various figures, and wherein.

DETAILED DESCRIPTION OF THE EXEMPLARY EMBODIMENTS OF THE PRESENT INVENTION

As the semiconductor industry moves to smaller and smaller integrated circuit features, the aspect ratio of the interconnects connecting these features increases and it becomes more and more difficult to obtain good etching and good gap fill results. Accordingly, metal etch and dielectric gap fill are seen as the industry's greatest challenges in moving to smaller dimensions. Damascene processing eliminates both of these conventional steps used in processing interconnects and, as a result, the industry has moved toward improving damascene processing techniques.

The steps involved in an exemplary prior art dual damascene metallization process are shown in FIGS. 3a–3f. The process typically begins with a silicon wafer substrate that is covered with an insulator layer. The insulator is typically a dielectric, and preferably a material having a low dielectric constant. Masking then takes place to create patterns for the via and trench, and an etch stop layer such as a thin silicon nitride layer is used to act as a hard mask.

Figure 3A:
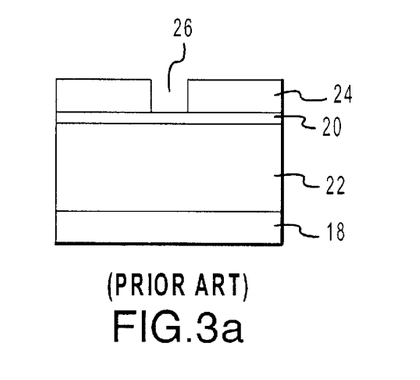
FIG. 3a is a cross section of a semiconductor device formed with prior art dual damascene processing showing deposition of an insulator, or dielectric material, over a wafer substrate, deposition of a silicon nitride layer over the insulator to form an etch stop, and patterning of a via with a photoresist.
Figure 3B:
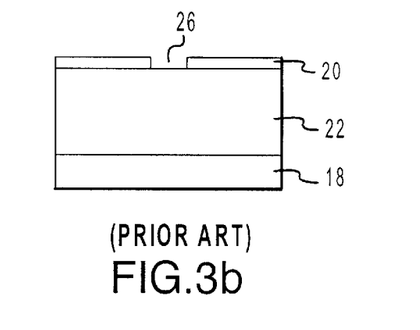
FIG. 3b is a cross section of the semiconductor device shown in FIG. 3a after etching the via pattern into the silicon nitride layer etch stop.
Figure 3C:
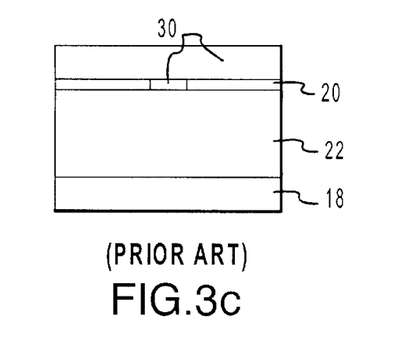
FIG. 3c is a cross section of the semiconductor device shown in FIG. 3b after depositing another layer of insulator, or dielectric material, over the silicon nitride layer containing the via pattern.
Figure 3D:
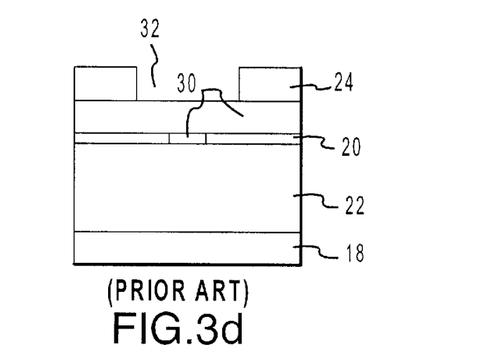
FIG. 3d is a cross section of the semiconductor device shown in FIG. 3c after patterning a trench over the second insulator layer with a photoresist.
Figure 3E:
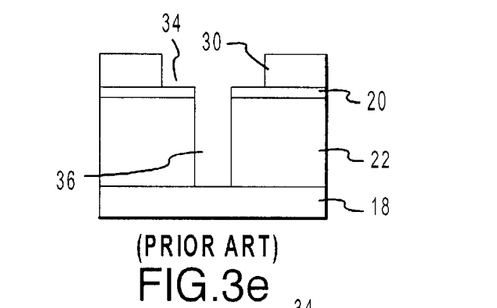
FIG. 3e is a cross section of the semiconductor device shown in FIG. 3d after etching the trench and via into the first and second insulator layers, respectively.
Figure 3F:
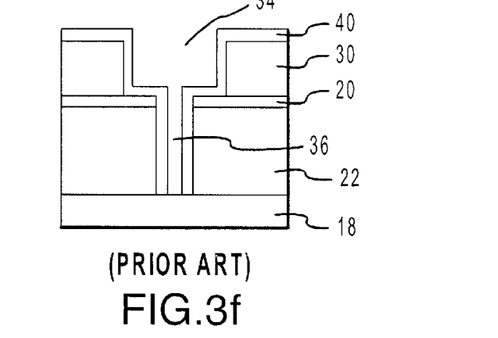
FIG. 3f is a cross section of the semiconductor device shown in FIG. 3e after depositing a barrier layer over the exposed surfaces of the via and trench.
Figure 3G:
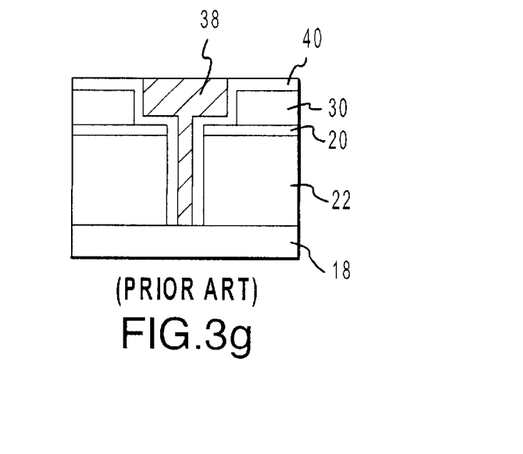
FIG. 3g is a cross section of the semiconductor device shown in FIG. 3f after filling the via and trench with a metal, performing metal CMP, and depositing a silicon nitride layer over the metal and the second layer of insulator.

In FIG. 3a, there is shown a cross section of a semiconductor device formed with prior art dual damascene processing showing deposition of an insulator 22, e.g. a dielectric material, over a wafer substrate 18, deposition of an etch stop such as a silicon nitride layer 20 over the insulator 22 to form an etch stop, and patterning of a via 26 with a photoresist 24. In a typical prior art dual damascene process, it is necessary to deposit an etch stop layer in order to improve process window and robustness. Examples of such etch stop layers include the use of a nitride layer, which is typically used as the etch stop layer for a dielectric using silicon dioxide, or the use of either a nitride or an oxide layer as the etch stop layer for a low constant dielectric material. Etching of the via pattern 26 into the silicon nitride etch stop 20 is shown in FIG. 3b. In FIG. 3c, a second layer of insulator 30 is deposited over the silicon nitride layer 20 containing the via pattern 26. Deposition of the insulator layers, silicon nitride layers, and photoresist may take place by a number of techniques including, but not limited to, spin on, electroplating, chemical vapor deposition, and sputtering. Next, a trench is patterned 32 over the second insulator layer 30 using a photoresist 24 as shown in FIG. 3d. After patterning the trench 32, the trench 34 and via 36 are etched into the second and first layers of insulator 30, 22, respectively as depicted in FIG. 3e. Next, as seen in FIG. 3f, a barrier layer is deposited over the exposed surfaces of the via and trench to prevent diffusion of metal after the via and trench are filled with a metal. Finally, as shown in FIG. 3g, the via 36 and trench 34 are filled with a metal 38, followed by metal CMP and deposition of a silicon nitride layer over the metal 38 and the second insulator layer 30.

One of the major advantages of the dual damascene process sequence shown in FIGS. 3a–3f is the need for only one etch step and one metal fill step. In addition to the advantages achieved by prior art dual damascene processing, the method and apparatus of the present invention for dual damascene processing possesses the further advantage of eliminating the need for deposition of an etch stop layer over the insulator, or dielectric material. Instead, the method and apparatus for dual damascene processing of the present invention utilizes a unique cure method which converts the topmost layer of insulator or dielectric material to an etch stop layer.

Figure 4A:
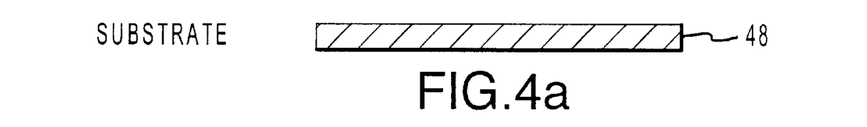
FIG. 4a is a cross section of a semiconductor device substrate.
Figure 4B:
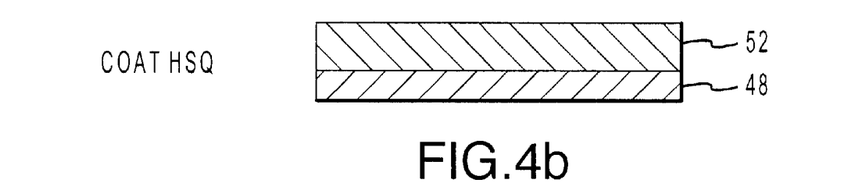
FIG. 4b is a cross section of a semiconductor device formed with the dual damascene metallization method and apparatus of the present invention showing deposition of a first low dielectric constant material layer over the wafer substrate.
Figure 4C:
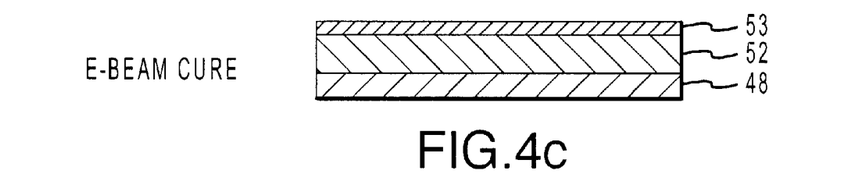
FIG. 4c is a cross section of the semiconductor device shown in FIG. 4b after forming a hard mask or etch stop in the topmost layer of the first low dielectric constant material layer by applying an electron beam or ion implantation to the first low dielectric constant material layer.
Figure 4D:
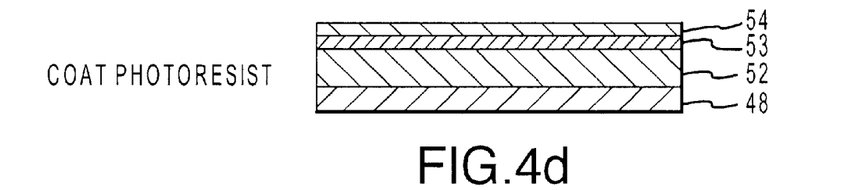
FIG. 4d is a cross section of the semiconductor device shown in FIG. 4c after depositing a photoresist over the first low dielectric constant material layer.
Figure 4E:
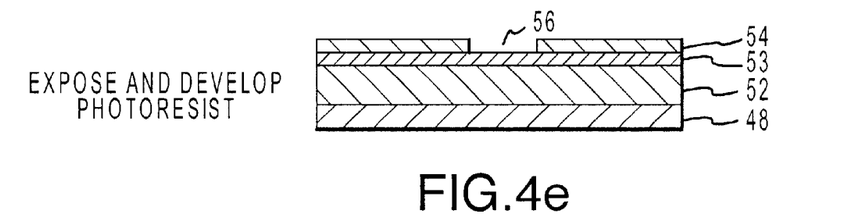
FIG. 4e is a cross section of the semiconductor device shown in FIG. 4d after exposing and developing the photoresist to form a pattern for a via opening.
Figure 4F:
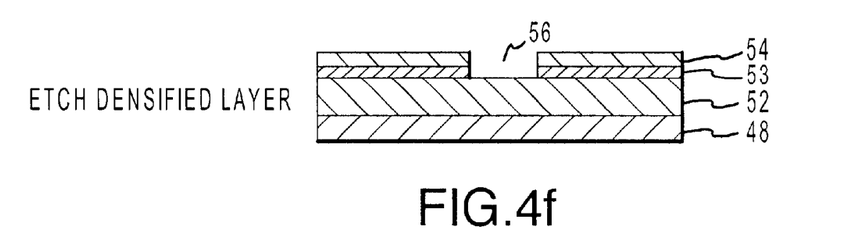
FIG. 4f is a cross section of the semiconductor device shown in FIG. 4e after etching the hard mask or etch stop of the first low dielectric constant material layer to form an opening for the via.
Figure 4G:
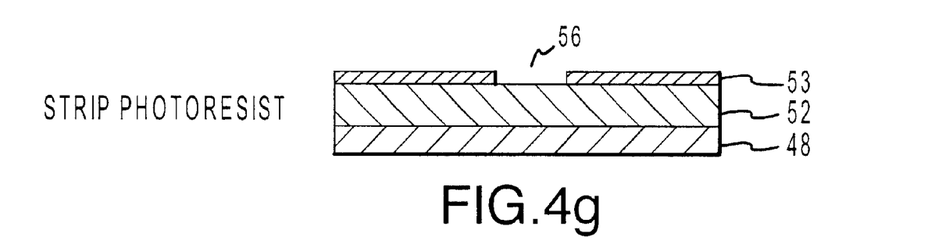
FIG. 4g is a cross section of the semiconductor device shown in FIG. 4f after stripping the photoresist from the surface of the hard mask or etch stop which forms the topmost layer of the first low dielectric constant material layer.
Figure 4H:
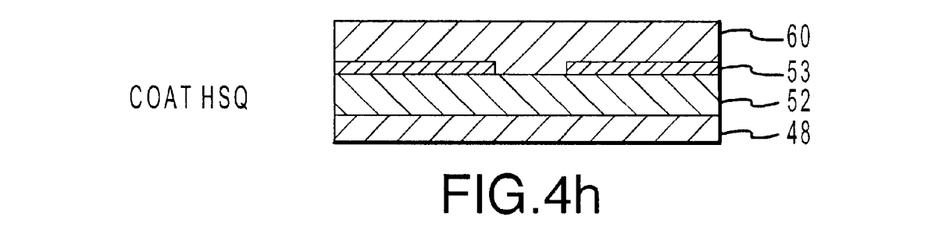
FIG. 4h is a cross section of the semiconductor device shown in FIG. 4g after deposition of a second low dielectric constant material layer over the hard mask or etch stop which forms the topmost layer of the first low dielectric constant material layer.
Figure 4I:
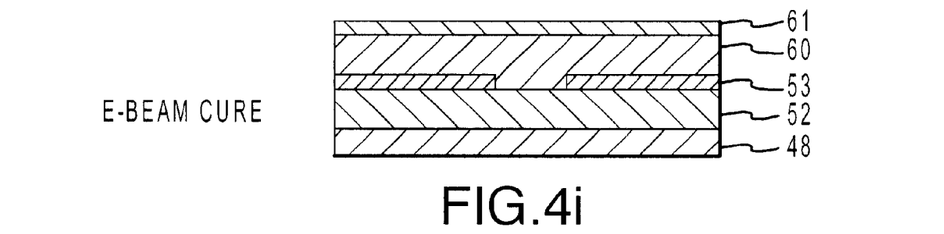
FIG. 4i is a cross section of the semiconductor device shown in FIG. 4h after forming a hard mask or etch stop in the topmost layer of the second low dielectric constant material layer by applying an electron beam or ion implantation to the second low dielectric constant material layer.
Figure 4J:
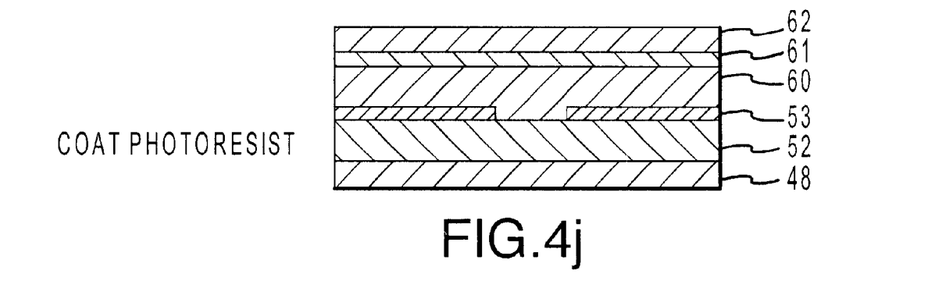
FIG. 4j is a cross section of the semiconductor device shown in FIG. 4i after depositing a photoresist over the second low dielectric constant material layer.
Figure 4K:
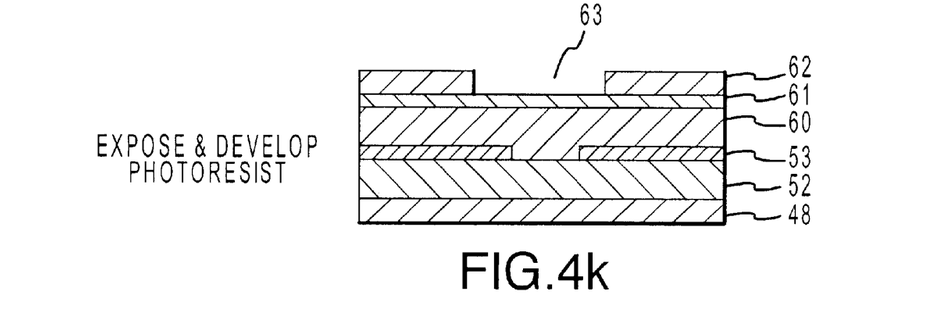
FIG. 4k is a cross section of the semiconductor device shown in FIG. 4j exposing and developing the photoresist to form a pattern for a trench opening.
Figure 4L:
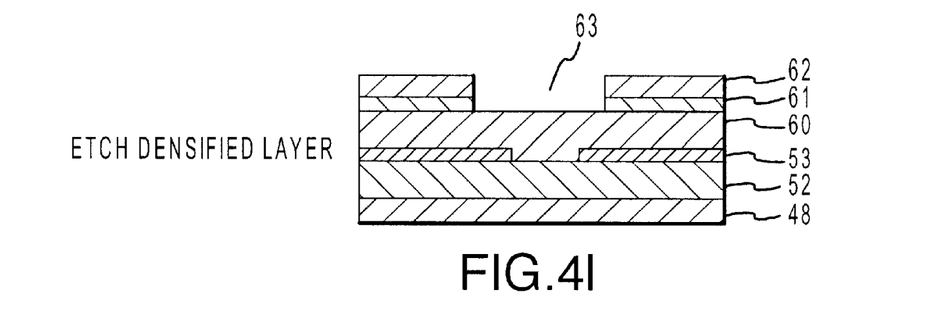
FIG. 4l is a cross section of the semiconductor device shown in FIG. 4k after etching the hard mask or etch stop of the second low dielectric constant material layer to form an opening for the trench.
Figure 4M:
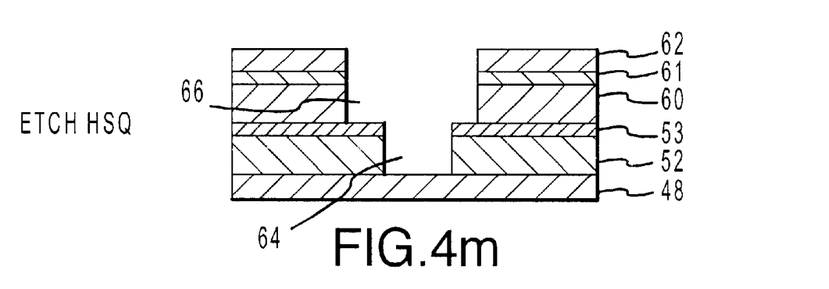
FIG. 4m is a cross section of the semiconductor device shown in FIG. 4l after etching the via and trench in the first and second low dielectric constant materials, respectively.
Figure 4N:
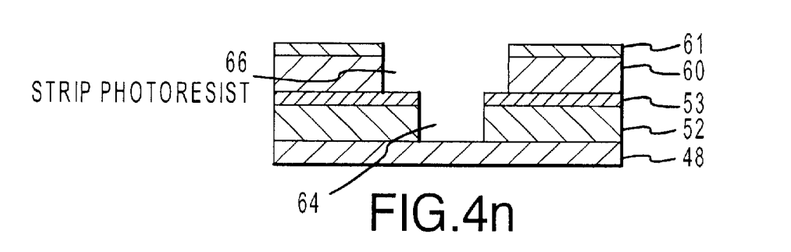
FIG. 4n is a cross section of the semiconductor device shown in FIG. 4m after stripping the photoresist from the surface of the hard mask or etch stop which forms the topmost layer of the second low dielectric constant material layer.
Figure 4O:
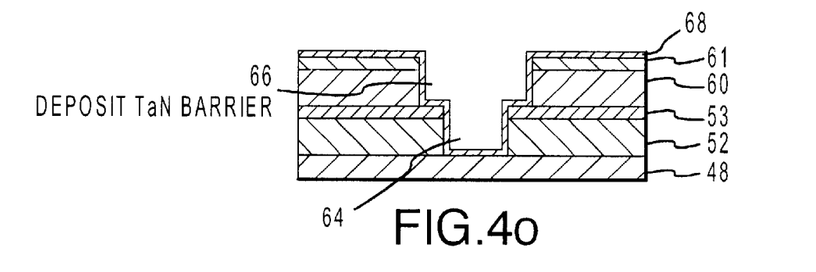
FIG. 4o is a cross section of the semiconductor device shown in FIG. 4n after depositing a barrier layer over the exposed surfaces of the via and trench.
Figure 4P:
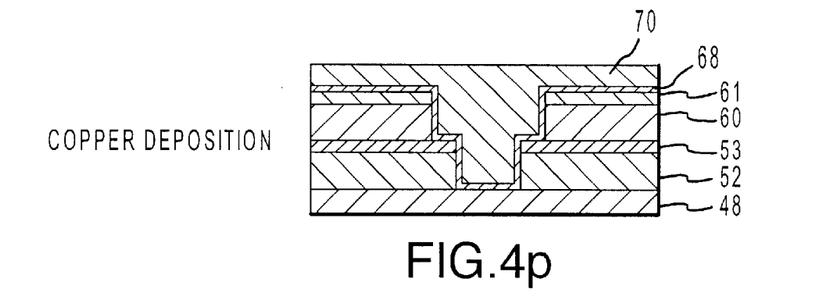
FIG. 4p is a cross section of the semiconductor device shown in FIG. 4o after filling the via and trench with a metal by metal deposition.
Figure 4Q:
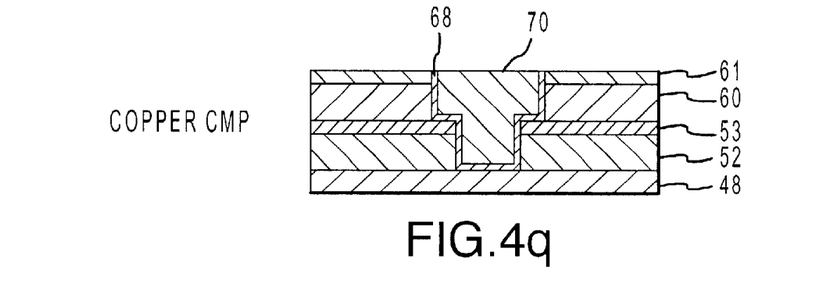
FIG. 4q is a cross section of the semiconductor device shown in FIG. 4p after performing metal CMP using the hard mask created in the topmost layer of the second low dielectric constant material layer as a CMP stop.

FIGS. 4a–4q show the sequence steps for the dual damascene metallization process of the present invention. Like the prior art dual damascene process, the dual damascene process of the present invention begins with the deposition of an insulator, preferably a material having a low dielectric constant 52, over a semiconductor wafer substrate 48 as shown in the cross-section of a semiconductor device depicted in FIG. 4b. Deposition of a first layer of the low dielectric constant material may be carried out by several techniques including, but not limited to, spin on, electroplating, chemical vapor deposition, vacuum evaporation, and sputtering.

Next, the first layer of low dielectric constant material 52 is cured by exposure to either an electron beam, which involves electron beam irradiation and rapid thermal heating, or ion implantation, which involves both ion implantation and rapid thermal heating. Exposure of the first low dielectric constant material layer 52 to an electron beam results in the conversion of the topmost layer of the first low dielectric constant material layer 52 into a first hard mask or etch stop 53 while rapid thermal heating associated with electron beam exposure cures the remainder of the first low dielectric constant material layer 52 so that it obtains its low dielectric constant properties. Similarly, exposure of the first low dielectric constant material layer to ion implantation results in the conversion of the topmost layer of the first low dielectric constant material layer into a first hard mask or etch stop, while the rapid thermal heating associated with ion implantation cures the remainder of the first low dielectric constant material layer. Formation of such a first hard mask or etch stop 53 in the topmost layer of the first low dielectric constant material layer 52 is shown in FIG. 4c.

After curing the first low dielectric constant material layer 52, a first layer of photoresist 54 is deposited over the first hard mask or etch stop 53 as shown in FIG. 4d. Deposition of the photoresist may be carried out by several techniques including, but not limited to, spin on. Next, as shown in FIG. 4e, the first layer of photoresist 54 is exposed and developed to form a pattern for a via opening 56. Following along to FIG. 4f, the first hard mask or etch stop 53 of the first low dielectric constant material layer 52 is etched to form an opening 56 for the via. The first layer of photoresist 54 is then stripped from the surface of the first hard mask or etch layer 53 which comprises the topmost layer of the first low dielectric constant material layer 52. Then, as shown in FIG. 4h, a second layer of low dielectric constant material 60 is deposited over the first layer of low dielectric constant material 52 having the first hard mask or etch step 53 creating its topmost layer wherein the opening 56 for the via is contained within the first hard mask or stop etch 53. The deposition of the second layer of low dielectric constant material 60 may be carried out by any of the techniques previously identified with respect to the deposition of the first layer of low dielectric constant material 52.

After depositing the second layer of low dielectric constant material 60 over the surface of the semiconductor device, the second layer of low dielectric constant material 60 is cured by exposure to either an electron beam or ion implantation as described above with reference to curing the first layer of low dielectric constant material 52. As shown in FIG. 4i, curing of the second layer of low dielectric constant material 60 with either an electron beam or ion implantation results in the creation of a second hard mask or etch stop 61 in the uppermost layer of the second layer of low dielectric constant material 60.

Next, as illustrated in FIG. 4j, a second layer of photoresist 62 is deposited over the surface of the semiconductor device, which now comprises the second hard mask or etch stop 61 contained within the uppermost layer of the second layer of low dielectric constant material 60. Then, as shown in FIG. 4k, the second layer of photoresist 62 is exposed and developed to pattern a trench opening 63 over the via pattern 56. Then, as shown in FIG. 4l, the second hard mask or etch stop 61 comprising the topmost layer of the second low dielectric constant material layer 60 is etched to form the trench opening 63 that was patterned by the second layer of photoresist 62.

In FIG. 4m, a via 64 and trench 66 are then etched into the first and second low dielectric constant material layers 52,60, respectively. After etching the via 64 and trench 66, the second layer of photoresist 62 is stripped from the second hard mask or etch stop 61 which comprises the topmost layer of the second low dielectric constant material layer 60.

A barrier layer 68 such as, for example, tantalum nitride, is then deposited over the surface of the semiconductor device to form a layer over the exposed surfaces of the via 64 and trench 66. This barrier layer 68 is deposited over the via 64 and trench 66 in order to prevent metal diffusion once the via 64 and trench 66 are filled with a metal. After depositing the barrier layer 68, the via 64 and trench 68 are filled with a metal 70, preferably copper. Finally, metal CMP is performed during which the second hard mask or etch stop 61 that comprises the topmost layer of the second low dielectric constant material layer 60 may serve as a CMP stop thereby improving process robustness and process window.

Figure 5:
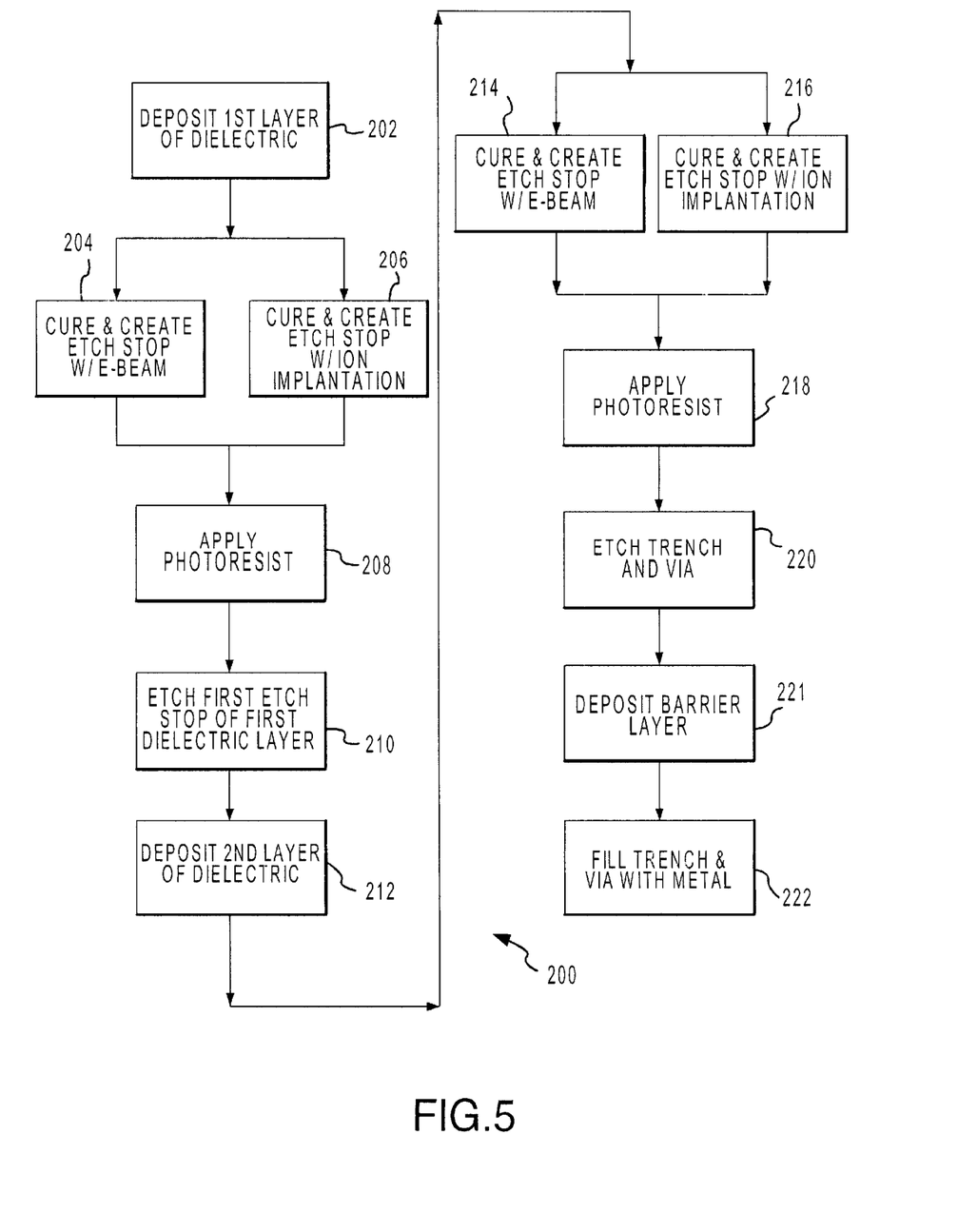
FIG. 5 is a flow chart setting forth various process steps employed in the dual damascene metallization process of the present invention.

A flow chart setting forth various process steps employed in the dual damascene metallization process of the present invention is shown in FIG. 5. First, a material having a low dielectric constant is deposited 202 on a substrate. This first layer of low dielectric constant material preferably possesses a dielectric constant within the range of 1.0 to 3.5. Many different types of materials may be used for the low dielectric constant material including, but not limited to, organic materials, inorganic materials, polymers, fluorine containing materials, and porous materials such as aorogels and xerogels. Some examples of more specific low dielectric constant materials include, but are not limited to, hydrogen silsesquioxane, methyl silsesquioxane, methyl siloxanes, fluorine less arylene ether, and benzocyclobutene.

Next, the first layer of low dielectric constant material is cured with an electron beam 204 or ion implantation 206, each of which convert the topmost layer of the first layer of low dielectric constant material into a first hard mask or etch stop. The energy of the electron beam controls the thickness of the hard mask or etch stop that is formed in the low dielectric constant material. Exemplary parameters for exposure to the electron beam are as follows:

|  | Standard | Minimum | Maximum |
| --- | --- | --- | --- |
| Energy | 2 keV | 1 keV | 8 keV |
| Dose | 5000 uc/cm$^2$ | not yet determined | 10,000 |
| Temperature | 400 C. | 300 C. | 450 C. |
| Ambient | Argon | N$_2$, O$_2$, forming gas, N$_2$H$_2$ Ammonia |  |
| Process Time | <3 minutes |  |  |
| Current | 10 mA |  | 20 mA |

One specific example of parameters involved in the cure process can be shown by curing a 4000 Angstrom film of a low dielectric constant material, such as hydrogen silsesquioxane, with an electron beam at 2 keV which produces an etch stop layer having a thickness of about 500 Angstroms. The thickness of the etch stop layer is preferably within a range of 300 to 500 Angstroms and this thickness level can typically be achieved within a low dielectric constant material with an electron beam having energy within a range of 1 to 10 keV.

After curing and creation of a first etch stop in the topmost layer of the first layer of low dielectric constant material, a photoresist is applied 208 over the first layer of low dielectric constant material having the first hard mask to pattern a via opening. Etching 210 then takes place to etch an opening for a via in the first hard mask or etch stop of the first layer of low dielectric constant material. The photoresist is removed and then a second layer of low dielectric constant material is deposited 212 over the surface of the semiconductor device. After deposition of the second layer of low dielectric constant material, the second layer of low dielectric constant material is cured by either exposure to an electron beam 214 or ion implantation 216. Curing results in the formation of a second hard mask or etch stop in the uppermost layer of the second layer of the low dielectric constant material. A photoresist is then applied 218 and a pattern for a trench opening s formed after the photoresist is exposed and developed. The via and trench are then etched 220 into the first and second layers of the low dielectric constant material, respectively. Next, a barrier layer such as tantalum nitride, for example, is deposited 221 to prevent metal diffusion after the via and trench are filled with metal. Finally, the via and trench are filled 222 with a metal. Copper is the preferred metal.

Metal CMP typically takes place after filling the via and trench with a metal. As previously stated, exposure of a low dielectric constant material to an electron beam or ion implantation involves both electron beam irradiation or ion implantation, in addition to rapid thermal heating, both of which occur simultaneously. Further, it should be pointed out that the bottom surface of the wafer substrate may be heated with a quartz lamp during curing with either an electron beam or ion implantation, in accordance with the present invention, to form the etch stop in the layers comprising a low dielectric constant material. In contrast, the conventional method for curing a low dielectric constant film in dual damascene processing involves thermal treatment only. Use of thermal treatment only in curing the low dielectric constant film does not create the hard mask or etch stop that is created by curing the low dielectric constant film with either an electron beam or ion implantation. Accordingly, those skilled in the art will appreciate that the dual damascene process of the present invention, which includes curing of the low dielectric constant material with an electron beam or ion implantation, will enable the hard mask or etch stop created in the uppermost layer of the low dielectric constant material to serve as a CMP stop during metal CMP after filling the via and trench with metal.

The method of the present invention for dual damascene processing may be carried out as either a single or multiple wafer process. With respect to a multiple wafer dual damascene process, the present invention contemplates the use of a load lock system wherein multiple chambers may be contained within a single machine and each chamber would be preset such that its interior was at a predetermined pressure and temperature thereby eliminating the time period required for bringing the chamber and wafers up to the appropriate pressure and temperature for processing. Movement of the wafers from one chamber to the next within such a tool would take place by way of a load lock system wherein the wafers are transferred into the various chambers without breaking the pressure and temperature parameters existing within the interior of the chambers.

It should be understood that the foregoing description is of exemplary embodiments of the invention and that the invention is not limited to the specific forms or strictures shown or described herein. Various modifications may be made in the design, arrangement, and type of elements and structures disclosed herein, as well as the steps of making and using the invention without departing from the scope of the invention as expressed in the appending claims.

We claim:

1. A method for dual damascene metallization comprising the steps of:
   depositing a first layer of dielectric material on a wafer substrate;
   curing said first layer of dielectric material such that a topmost layer of said first layer of dielectric material is converted into a first etch stop;
   applying a photoresist pattern to said first layer of dielectric material to form a pattern for a via opening;
   etching said first etch stop in said first layer of dielectric material to form said via opening in said first layer of dielectric material;
   depositing a second layer of dielectric material to said first layer of dielectric material comprising said via opening;
   curing said second layer of dielectric material such that a topmost layer of said second layer of dielectric material is converted into a second etch stop;
   applying a photoresist pattern to said second layer of dielectric material to form a pattern for a trench opening;
   etching said second and first layers of dielectric material to form a trench and via, respectively; and
   filling said via and trench with a metal.

2. The method of claim 1 further comprising the step of depositing a barrier layer prior to said step of filling said via and trench with a metal.

3. The method of claim 1 wherein at least one of said step of depositing a first layer of dielectric material and said step of depositing a second layer of dielectric material comprises depositing a material having a low dielectric constant within a range of about 1.0 to 3.5.

4. The method of claim 1 wherein at least one of said step of depositing a first layer of dielectric material and said step of applying a second layer of dielectric material comprises depositing a material having a low dielectric constant comprising at least one of an organic material, an Inorganic material, a polymer, a fluorine containing material, and a porous material.

5. The method of claim 4 wherein said step of depositing a material having a low dielectric constant comprises depositing at least one of a hydrogen silsesquioxane, a methyl silsesquioxane, a methyl siloxane, a fluorineless arylene ether, and a benzocyclobutene.

6. The method of claim 1, wherein at least one of said step of curing said first layer of dielectric material and said step of curing said second layer of dielectric material comprises exposing an electron beam to at least one of said first layer and said second layer of dielectric material, respectively.

7. The method of claim 6, wherein exposing said electron beam comprises applying said electron beam to at least one of said first and second dielectric layers wherein said electron beam comprises energy within a range of 1 kev to 10 kev.

8. The method of claim 7 wherein said energy of said electron beam is used to control a thickness of at least one of said first and second etch stops.

9. The method of claim 6 wherein exposing said electron beam comprises applying said electron beam to at least one of said first and second dielectric layers while the wafer substrate is at a temperature within a range of 300 degrees C to 450 degrees C.

10. The method of claim 6 wherein exposing said electron beam comprises applying said electron beam to at least one of said first and second dielectric layers wherein said electron beam is applied within the presence of an ambient comprising at least one of an argon gas, a nitrogen gas, an oxygen gas, and an ammonia gas.

11. The method of claim 6 wherein exposing said electron beam comprises applying said electron beam to at least one of said first and second dielectric layers wherein said electron beam is applied having a current within a range of 10 mA to 20 mA.

12. The method of claim 9 further comprising the step of heating said wafer substrate, and any additional layers comprised thereon, by placing said wafer substrate on a hot plate during the dual damascene metallization process.

13. A method for creating an etch stop during a dual damascene metallization process comprising the steps of:
   depositing a layer of dielectric material on a substrate; and
   exposing said dielectric layer to an electron beam such that a topmost layer of said dielectric material forms an etch stop layer.

14. The method of claim 13 wherein said step of depositing a layer of dielectric material comprises depositing a material having a low dielectric constant within a range of about 1.0 to 3.5.

15. The method of claim 13 wherein said step of depositing a layer of dielectric material comprises depositing a material having a low dielectric constant comprising at least one of an organic material, an inorganic material, a polymer, a fluorine containing material, and a porous material.

16. The method of claim 15 wherein said step of depositing a material having a low dielectric constant comprises depositing at least one of a hydrogen silsesquioxane, a methyl silsesquioxane, a methyl siloxane, a fluorineless arylene ether, and a benzocyclobutene.

17. A method for creating an etch stop during a dual damascene metallization process comprising the steps of:

depositing a layer of dielectric material on a substrate; and exposing said dielectric layer to ion beam implantation such that a topmost layer of said dielectric material forms an etch stop layer.

18. The method of claim 17 wherein said step of depositing a layer of dielectric material comprises depositing a material having a low dielectric constant within a range of about 1.0 to 3.5.

19. The method of claim 17 wherein said step of depositing a layer of dielectric material comprises depositing a material having a low dielectric constant comprising at least one of an organic material, an inorganic material, a polymer, a fluorine containing material, and a porous material.

20. The method of claim 19 wherein said step of depositing a material having a low dielectric constant comprises depositing at least one of a hydrogen silsesquioxane, a methyl silsesquioxane, a methyl siloxane, a fluorineless arylene ether, and a benzocyclobutene.

* * * * *